United States Patent [19]

Izunome et al.

[11] Patent Number: 5,477,805
[45] Date of Patent: Dec. 26, 1995

[54] PREPARATION OF SILICON MELT FOR USE IN PULL METHOD OF MANUFACTURING SINGLE CRYSTAL

[75] Inventors: Koji Izunome, 1770-1-502 Arakawaoki, Ami-machi, Inashiki-gun, Ibaragi-ken, 300-11; Xin ming Huang, Ibaragi; Kazutaka Terashima, 206-3 Nakano, Ebina-shi, Kanagawa-ken, 234-04; Shigeyuki Kimura, Ibaragi, all of Japan

[73] Assignees: Research Development Corporation of Japan, Saitama; Koji Izunome, Ibaragi; Kazutaka Terashima, Kanagawa, all of Japan

[21] Appl. No.: 350,533

[22] Filed: Dec. 7, 1994

[30] Foreign Application Priority Data

Dec. 28, 1993 [JP] Japan ................................. 5-335359

[51] Int. Cl.⁶ ............................................. C30B 15/20
[52] U.S. Cl. ................................... 117/13; 117/20
[58] Field of Search ........................ 117/13, 20, 54, 117/932

[56] References Cited

U.S. PATENT DOCUMENTS 4,591,409  5/1986  Ziem et al. ............................ 117/20

FOREIGN PATENT DOCUMENTS 0435440A  7/1991  European Pat. Off. ..
0046578A  4/1975  Japan ................................ 117/54

*Primary Examiner*—R. Bruce Breneman
*Assistant Examiner*—Fehisa C. Garrett
*Attorney, Agent, or Firm*—Beveridge, DeGrandi, Weilacher & Young

[57] ABSTRACT

A Si material mixed with Group-V element is melted in a crucible, and then held in a chamber filled with a rare gas at atmospheric pressure of 100 torr. or higher. A rare gas, e.g. Ar, Kr, Xe or Rn, having a large mass or the mixture of Ar with Kr, Xe or Rn may be used as atmospheric gas. The high-pressure atmosphere suppress the evaporation of oxides of Group-V elements from the Si melt, so that the Si melt can be maintained at a high oxygen concentration under a stable condition until the start of pulling operation.

5 Claims, 2 Drawing Sheets

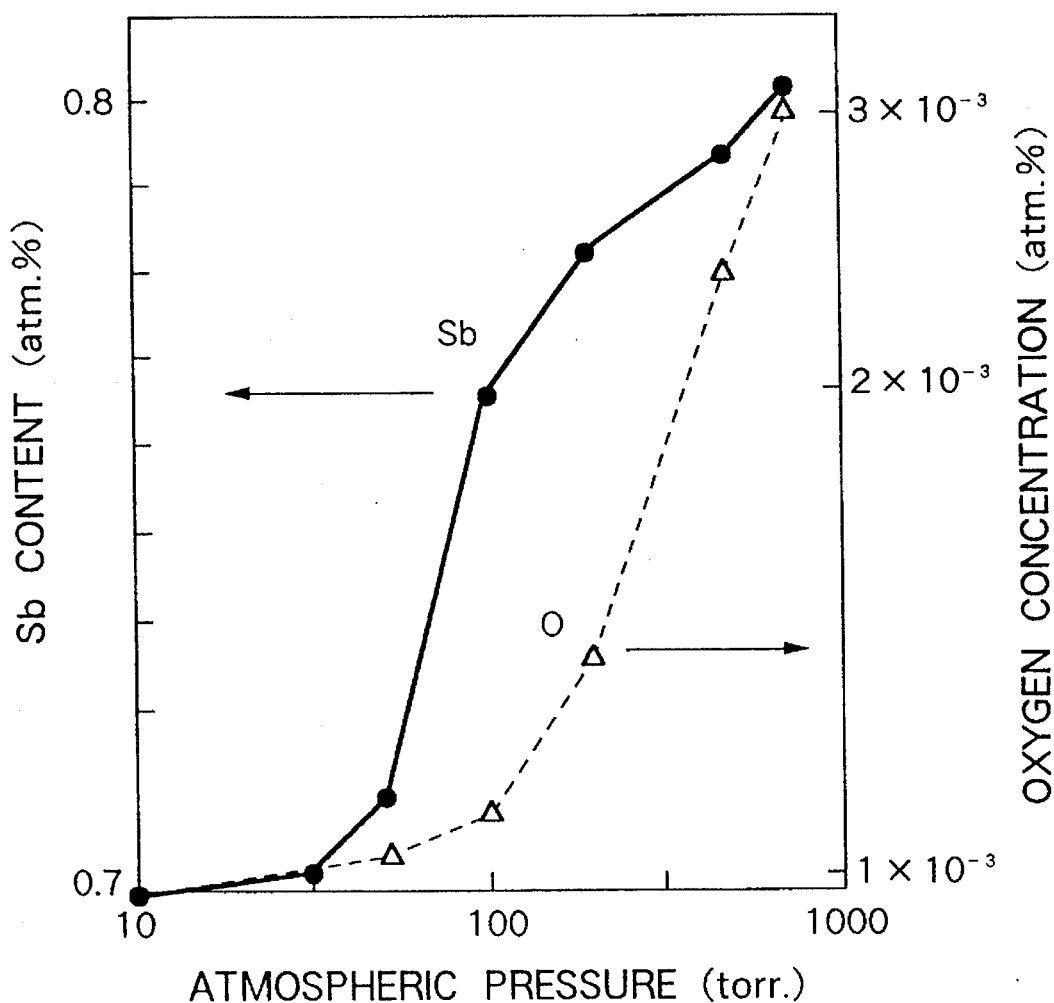

PREPARATION OF SILICON MELT FOR USE IN PULL METHOD OF MANUFACTURING SINGLE CRYSTAL

INDUSTRIAL APPLICATION

The present invention relates to a method of preparing a Si melt suitable for the growth of a Si single crystal in which the oxygen concentration is stabilized at a higher level.

BACKGROUND OF THE INVENTION

The Czochralski method is a representative method for the growth of a single crystal from a melt.

The Czochralski method uses a crucible 2 provided in a closed chamber 1 as shown in FIG. 1. The crucible 2 is supported by a support 3 so that tile crucible 2 is capable of rotation and/or vertical motion. There are concentrically disposed a heater 4 and a heat insulator 5 around the crucible 2.

A raw material is received in the crucible 2 and intensively heated by the heater 4 to prepare a melt 6. The melt 6 is held at a temperature suitable for the growth of a single crystal.

When a seed crystal 7 being hung from a rotary winder 10 through a wire 9 is brought into contact with the melt 6, a single crystal 8 grows on the seed crystal 7 so that the crystalline orientation of the seed crystal 7 is transferred to that of the growing crystal 8. The seed crystal 7 is then rotatingly pulled up in response to the growth of the single crystal 8. The crucible 2 is descendingly rotated by the rotating motion of the support 3, too. The descending speed and rotating speed of the support 3, the ascending speed and rotating speed of the seed crystal 7, etc. are controlled in response to the growing speed of the single crystal 8 being pulled up from the melt 6.

When a melt 6 mixed with Sb as a type-n impurity is used in the pull method, Sb is introduced into an obtained single crystal 8. Hereby, a semiconductor material having high conductivity is obtained.

In addition, the melt 6 contains oxygen originated in $SiO_2$ dissolved from the crucible. Said oxygen is intorduced into the single crystal 8, too. Oxygen included in the single crytal 8 is precipitated in bulk during the heat treatment of the single crystal 8, resulting in the formation of precipitation faults. The faults serve as a gettering center for capturing heavy metal impurities, which remain on the surface layer of a semiconductor single crystal substrate to be incorporated in an electronic device, and render the impurities into a harmless state. Oxygen dissolved in the single crystal effectively improves the strength of the semiconductor single crystal substrate.

In this consequence, it is preferable to maintain the oxygen concentration of the melt at a higher level, so that the higher oxygen concentration of the melt increases the concentration of oxygen to be incorporated in the single crystal. However, it is difficult to maintain the oxygen concentration of the melt at a higher lever under stable conditions.

We have found the effect of Sb on oxygen concentration during the research and investigation of the physical property of a Si melt. When a large amount of Sb is added to the Si melt, the oxygen concentration of the Si melt becomes higher linearly with the increase of Sb content in the Si melt. The relationship of Sb content with oxygen concentration can be utilized for calculating the oxygen concentration of the Si melt from the Sb content, as we have disclosed in Japanese Patent Application 5-69924.

A Si melt containing a large amount of Sb exhibits the tendency to accelerate the diffusion of oxygen as $Sb_2O$, SiO, etc. from the surface of the melt into the atmosphere. This tendency is recognized in another Si melt doped with different Group-V element such as P, As or Bi.

As oxygen is diffused from the surface of the melt, the oxygen concentration of the melt changes so that the oxygen concentration of an obtained Si single crystal is remarkably reduced. Hereby, the concentrations of Sb and oxygen becomes lower due to the evaporation of $Sb_2O$, during a melt homogenizing period from the addition of Sb to the start of pulling operation. If the concentration becomes unexpectedly lower, it is necessary to re-prepare another melt. As a result, the productivity becomes worse, and the obtained single crystal has unstable oxygen concentration.

SUMMARY OF THE INVENTION

The present invention is accomplished in order to prepare a Si melt having a composition suitable for the growth of single crystal having high oxygen concentraion in the pull method without,the problems above-mentioned.

An object of the present invention is to prepare a Si melt containing a Group-V element and oxygen in the proper amounts at the period when the pulling operation is started, by holding the Si melt in a high-pressure atmosphere until the start of the pulling operation or during the interval before the next pulling-step so as to inhibit the evaporation of the oxides of the Group-V element from the Si melt.

According to the present invention, a Si melt is prepared as follows: A Si material mixed with Group-V element is melted in a crucible. The resulting melt is held in a chamber filled with rare gas at atmospheric pressure of 100 torr. or higher, until the start of pulling operation or during the period before the next pulling step.

The atmospheric gas may be a rare gas or gases having a large mass selected from Ar, Kr, Xe and Rn, or the mixture of Ar with a rare gas or gases having a large mass selected from Kr, Xe and Rn.

The preparing method according to the present invention is typically useful for a Si melt doped with Group-V element such as P, As, Sb or Bi. Specifically, the oxygen concentration in a Si melt containing $1.0 \times 10^{-4}$ atm. % of P or As, or 0.01 atm. % of Sb or Bi can be maintained at a constant level according to the present invention. Oxygen concentration in the following explanation is figured using JEIDA conversion value (3.03).

BRIEF DESCRIPTION OF THE DRAWINGS

FIG. 2 is a graph illustrating the effect of atmospheric pressure on the oxygen concentration and Sb content of a Si melt.

DETAILED DESCRIPTION OF THE PREFERRED EMBODIMENTS

Figure 1:
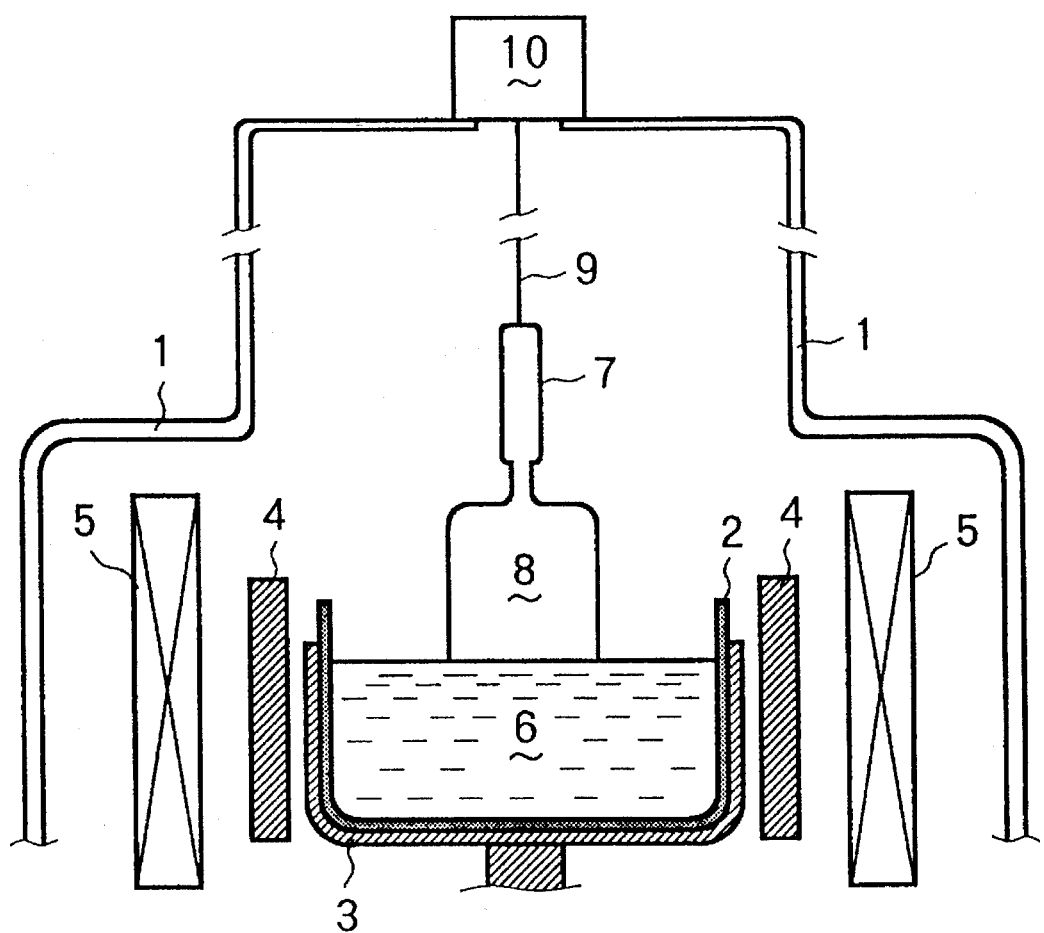
FIG. 1 is a view for explaining the Czochralski method whereby a single crystal is pulled up from a melt.

A Group-V element is reacted with oxygen dissolved from a crucible into a melt, and changed to an oxide, e.g. $PO_x$, $AsO_x$, $SbO_x$ or $BiO_x$, having large vapor pressure. In the meanwhile, the crucible receiving the Si melt therein is located in an decompressed atmosphere to which Ar gas is ordinarily introduced. In this way, the oxide is actively evaporated from tile surface of the Si melt, so as to reduce the Group-V element and oxygen included in the Si melt.

The evaporation of the oxide is suppressed by raising the atmospheric pressure according to the present invention. The evaporation of the oxide is reduced by using a rare gas having a large mass or the mixture of Ar with a rare gas, e.g. Kr or Xe, having a large mass as an atmospheric gas, too.

The effect of the atmospheric gas to suppress the evaporation of the oxide is believed to be as follows: Presume a single crystal is pulled up from a Si melt held in an atmosphere filled with an ideal gas. The frequency f that gaseous molecules diffusing from the surface of the melt come into collision with gaseous molecules in the atmosphere has the relationship of $f \propto P^2$ with the pressure P of the atmosphere. As the increase of the collision frequency f, the evaporation from the surface of the melt is suppressed so that an amount of oxygen diffused from the surface of the melt is reduced.

In a Si melt doped with Group-V element, each element is evaporated as a sole element or oxide from the surface of the Si melt. Since the evaporated substances show higher vapor pressures at a temperature below 1500° C. as compared with SiO, the atmospheric pressure exhibits a substantial effect to control the evaporation of Group-V element and oxygen.

The mass of a rare gas has influence on the oxygen concentration of the surface layer of the Si melt. The effect of the mass is believed to be as follows: Presume a single crystal is pulled up from a Si melt held in an atmosphere filled with an ideal gas. The frequency f that gaseous molecules diffused from the surface of the Si melt come into collision with gaseous molecues in the atmosphere is in inverse proportion to the square root of the mass $m_g$ of the atmospheric gas. A collision energy E has the relationshiip of $E=K \times m_g$ (herein, K is a constant) with the mass $m_g$. Accordingly, the frequency f that the evaporated molecucs come into collision with the atmospheric gas is proportional to the square root of the mass $m_g$.

According to the presumption above-mentioned, it is expected that the diffusion of gaseous molecules from the surface of the Si melt is suppressed by using a rare gas having a mass larger than that of Ar which is commonly used in the pull method. Since the suppresion of diffusion means less evaporation of oxides, the oxygen concentration in the surface layer of the Si melt, in its turn the oxygen concentration of an obtained Si single crystal can be maintained at a higher level. The effect of the mass of the rare gas on the oxygen concentration is the same in the case where a rare gas is mixed in Ar which is commonly used in the pull method.

Consequently, the evaporation of oxides is suppressed by increasing the atmospheric pressure or by using the rare gas having a large mass. The effect of the atmospheric pressure becomes apparent, when the atmospheric pressure is 100 torr. or higher. In this way, Group-V elements added to the Si melt and oxygen dissolved from the crucible are efficiently consumed in the single crystal being pulled up from the melt, without evaporation loss during the period while the Si melt is rendered homogeneous before the start of pulling operation.

The same effect is obtained in a period after the beginning of melting Si material or a period waiting for the next pulling step, by controlling the atmospheric condition. For instance, the temperature of the Si melt is properly controlled before the start of pulling operation. Thus, the Si melt can be held in a high-pressure atmosphere or an atmosphere comprising a rare gas having a large mass so as to inhibit the change of its composition.

Since the single crystal obtained in this way has a high oxygen concentration and contains a Group-V element as a dopant, a semiconductor substrate made from the single crystal exhibits the excellent gettering property that heavy metals are effectively captured while making the leakage of electricity smaller. In addition, the oxygen concentration is adjusted in a predetermined range, so that the semiconductor substrate can be used with high reliability.

EXAMPLE

Example 1

20 g Pure Si was received in a crucible of 50 mm in inner diameter and 60 mm in height, and heated with a temperature gradient of 50° C. along a vertical direction until the surface of the Si material was heated up to 1450° C. The Si material was held for 30 minutes under this condition, and then 0.7 g pure Sb was added to the prepared Si melt. The melt was further held for 30 minutes under the same temperature condition to prepare a Si melt doped with Sb. The Sb content and oxygen concentration of the obtained Sb-doped Si melt were measured. The Sb content was 0.8 atm. %, and the oxygen concentration was 0.001 atm. %.

The Sb-doped Si melt was heated at a temperature within the range of 1426°–1542° C. in an Ar atmosphere while variously changing the atmospheric pressure. After the melt was held for 90 minutes, the Sb content and oxygen concentration of the melt were measured. The measuring results are shown in FIG. 2 in relationship with the atmospheric pressure. It is noted that Sb content after 90 minutes holding was remarkably lowered in comparison with the initial Sb content 0.80 atm. %, when the atmospheric pressure was 50 torr, or lower. The reduction degree of Sb content became smaller as the increase of the atmospheric pressure. When the atmospheric pressure was 200 torr. or higher, Sb content was reduced by only 0.03 atm. %.

The concentration of oxygen, originated in the dissolution of $SiO_2$ from the crucible into the melt, was at a lower level, when the melt was held at lower atmospheric pressure. In the zone where Sb content was lower, the oxygen concentration was not remarkably reduced in response it the atmospheric pressure. This is caused by the fact that an amount of oxygen to be diffused as $Sb_2O$ is small, while oxygen is continuously supplied from the crucible to the melt. On the other hand, when the atmospheric pressure was 100 torr. or higher, oxygen concentration was maintained at a level of $1.4 \times 10^{-3}$ atm. % or higher regardless high Sb content.

According to the results, amounts of Sb and O to be lost as $Sb_2O$ can be reduced by maintaining an atmosphere, with which a Si melt is held in contact, at a pressure of 100 torr. or higher. Hereby, Sb added to the melt and oxygen dissolved from the crucible are both efficiently incorporated in an obtained single crystal.

Example 2

An Sb-doped Si melt was prepared under the same melting condition as that in Example 1, and then held for 90 minutes in various atmospheres. After 90 minutes holding, Sb content and oxygen concentration in the melt were measured. The measuring results are shown in Table 1 in the relation with the atmospheric pressure and the kind of rare gas. It is noted from Table 1 that the reduction of Sb content and oxygen concentration was suppressed when a rare gas having a large mass was used as the atmospheric gas even at the same atmospheric pressure.

TABLE 1

RELATIONSHIP OF KIND OF RARE GAS WITH
Sb CONTENT AND OXYGEN CONCENTRATION

| | RARE GAS | | | | | |
|---|---|---|---|---|---|---|
| | Ar | | Kr | | Xe | |
| PRESSURE | Sb | O | Sb | O | Sb | O |
| 10 | 0.702 | 1.00 | 0.724 | 1.76 | 0.750 | 2.58 |
| 30 | 0.702 | 1.01 | 0.726 | 1.77 | 0.751 | 2.59 |
| 50 | 0.710 | 1.03 | 0.732 | 1.78 | 0.755 | 2.60 |
| 100 | 0.754 | 1.10 | 0.765 | 1.84 | 0.777 | 2.63 |
| 200 | 0.771 | 1.37 | 0.778 | 2.04 | 0.786 | 2.76 |
| 500 | 0.782 | 2.38 | 0.786 | 2.81 | 0.791 | 3.27 |
| 760 | 0.790 | 3.00 | 0.792 | 3.28 | 0.795 | 3.58 |

Pressure means atmospheric pressure represented by torr.
Sb content is shown by atm. %.
Oxygen concentration is shown by atm. %×10$^{-3}$.

Example 3

An Sb-doped Si melt was prepared under the same melting condition as that in Example 1, and then held for 90 minutes in an Ar atmosphere mixed with rare gas at 30 torr. After 90 minutes holding, Sb content and oxygen concentration in the melt were measured. The measuring results are shown in Table 2 in response to the mixing ratio of rare gas. It is noted from Table 2, the reduction of Sb content and oxygen concentration was suppressed to lower degrees as the increase of the mixing ratio of the rare gas having a large mass.

TABLE 2

EFFECT OF MIXING RATIO OF RARE GAS ON
REDUCTION OF Sb CONTENT AND OXYGEN

| RARE GAS | MIXING RATIO (vol.%) | Sb CONTENT (atm.%) | OXYGEN CONCENTRATION (atm.% × 10$^{-3}$) |
|---|---|---|---|
| Kr | 10 | 0.702 | 1.23 |
| | 20 | 0.705 | 1.31 |
| | 30 | 0.708 | 1.37 |
| | 40 | 0.710 | 1.45 |
| | 50 | 0.712 | 1.51 |
| Xe | 10 | 0.705 | 1.31 |
| | 20 | 0.710 | 1.45 |
| | 30 | 0.715 | 1.61 |
| | 40 | 0.720 | 1.75 |
| | 50 | 0.725 | 1.91 |

According to the present invention as above-mentioned, a Si-melt doped with Group-V element is held in a high-pressure atmosphere to suppress the evaporation of oxides, at a period before the start of pulling operation or at a period for controlling the temperature of the Si melt. Owing to the high-pressure atmosphere, the Si melt substantially keeps its composition constant until the start of pulling operation. A rare gas having a large mass may be optionally used instead of Ar or mixed in Ar to prepare the atmosphere.

By the control of the atmospheric condition, the reduction of Group-V element and oxygen concentration, which would be lost as oxides diffused from the surface of the melt, can be suppressed during the period when the Si melt is rendered homogeneous or during the period when the Si melt is conditioned for pulling operation.

As described, the Si melt for used in the pull method of manufacturing a single crystal is adjusted to an objective concentration, without necessity of re-melting another Si material. In addition, the deviation in the composition of the Si melt is inhibited by maintaining the atmosphere at a higher pressure until the start of pulling operation, so that the pulling operation may be performed in response to production schedule without any limitation derived from the time elasped from the preparation of the melt.

What is claimed is:

1. A method of preparing a Si melt for use in a pull method of manufacturing single crystal comprising:

melting a Si material mixed with a Group-V element in a crucible, and holding said Si melt in a chamber filled with a rare gas at an atmospheric pressure of at least 100 torr. sufficient to suppress the evaporation of said Group-V element, before the start of pulling operation.

2. The method according to claim 1, wherein the rare gas comprises one or more having a large mass selected from Ar, Kr, Xe and Rn.

3. The method according to claim 1, wherein the rare gas comprises the mixture of Ar with one or more having a large mass selected from Ar, Kr, Xe and Rn.

4. The method according to claim 1, wherein the Si melt is held at said pressure at the period from the melting of the Si material to the start of pulling operation.

5. The method according to claim 1, wherein the Si melt is held at said pressure at the period when the Si melt is conditioned before the next pulling step.

* * * * *